(12) United States Patent
Misra (10) Patent No.: US 6,530,967 B1
(45) Date of Patent: Mar. 11, 2003

(54) STABILIZED SLURRY COMPOSITIONS

(75) Inventor: Ashutosh Misra, Dallas, TX (US)

(73) Assignee: Air Liquide America Corporation, Houston, TX (US)

( * ) Notice: Subject to any disclaimer, the term of this patent is extended or adjusted under 35 U.S.C. 154(b) by 0 days.

(21) Appl. No.: 09/444,715

(22) Filed: Nov. 24, 1999

Related U.S. Application Data (60) Provisional application No. 60/109,683, filed on Nov. 24, 1998.

(51) Int. Cl.$^7$ .............................. C09K 3/14; C09G 1/02; C09G 1/04; B24B 1/00
(52) U.S. Cl. ............................. 51/307; 51/308; 51/309; 106/3; 438/692; 438/693
(58) Field of Search ........................ 51/307, 308, 309; 106/3; 438/692, 693; 252/79.2, 79.4, 79.1; 510/397

(56) References Cited

U.S. PATENT DOCUMENTS

| | | | |
|---|---|---|---|
| 4,051,056 A | * 9/1977 | Hartman | 252/99 |
| 4,240,919 A | * 12/1980 | Chapman | 510/369 |
| 4,541,944 A | * 9/1985 | Sanderson | 252/95 |
| 4,550,074 A | 10/1985 | Tzinis et al. | |
| 5,039,515 A | * 8/1991 | Korf | 424/53 |
| 5,209,816 A | 5/1993 | Yu et al. | |
| 5,290,361 A | 3/1994 | Hayashida et al. | |
| 5,302,311 A | 4/1994 | Sugihara et al. | |
| 5,648,448 A | 7/1997 | Marrocco, III et al. | |
| 5,783,489 A | 7/1998 | Kaufman et al. | |
| 5,798,327 A | * 8/1998 | Casteleijn et al. | 435/209 |
| 5,922,091 A | * 7/1999 | Tsai et al. | 51/309 |
| 5,980,775 A | 11/1999 | Grumbine et al. | |
| 5,993,686 A | * 11/1999 | Streinz et al. | 51/309 |
| 6,001,269 A | 12/1999 | Sethuraman et al. | |
| 6,027,669 A | 2/2000 | Miura et al. | |
| 6,063,306 A | * 5/2000 | Kaufman et al. | 252/79.4 |
| 6,068,787 A | * 5/2000 | Grumbine et al. | 252/79.1 |
| 6,126,853 A | * 10/2000 | Kaufman et al. | 252/79.1 |
| 6,136,711 A | * 10/2000 | Grumbine et al. | 438/692 |
| 6,136,714 A | 10/2000 | Schutz | |

FOREIGN PATENT DOCUMENTS

| | | |
|---|---|---|
| EP | 0 823 465 | 2/1998 |
| EP | 0 844 290 | 5/1998 |
| WO | WO98/13536 | 4/1998 |

OTHER PUBLICATIONS

John P. Bare and Budge Johl, "Evaluation of Manufacturing Handling Characteristics of Hydrogen Peroxide–Based Tungsten CMP Slurry", 1988 IEEE/CPMT International Electronics Manufacturing Technology Symposium, pp. 164–171 (No month).

"Evaluation of Manufacturing Handling Characteristics of Hydrogen Peroxide–Based Tungsten CMP Slurry," John P. Bare and Budge Johl, 1998 IEEE/CPMT Int'l Electronics Manufacturing Technology Symposium, pp. 164–71. no month.

"Manufacturability of the CMP Process," Farid Malik and Masood Hasan, Thin Solid Films 270, 1995, pp. 612–15. no month.

"Chemical–mechanical Polishing: A New Focus on Consumables," Pete Singer, Semiconductor International, Feb. 1994, pp. 48–50, 52.

"Emerging Developments in CMP for Semiconductor Planarization," Michael A. Fury, Solid State Technology, Apr. 1995, pp. 47, 48, 50, 52, 54.

"Emerging Developments in CMP for Semiconductor Planarization –Part 2," Michael A. Fury, Solid State Technology, Jul. 1995, pp. 81–82, 84, 86.

"The Early Days of CMP," Michael A. Fury, Solid State Technology, May 1997, pp. 81, 82, 84, 86.

\* cited by examiner

Primary Examiner—Michael Marcheschi
(74) Attorney, Agent, or Firm—Linda K. Russell (57) ABSTRACT

Provided are slurry compositions suitable for use in a chemical-mechanical planarization process and methods for making same. The compositions include: (a) abrasive particles dispersed in a suspension medium; (b) a peroxygen compound; and (c) a stabilizing agent. The stabilizing agent includes a phosphoric acid, a salt of a phosphoric acid or combinations thereof. The invention has particular applicability to the semiconductor manufacturing industry.

38 Claims, 6 Drawing Sheets

STABILIZED SLURRY COMPOSITIONS

CROSS REFERENCES TO RELATED APPLICATIONS

This application claims under 35 U.S.C. §119(e) the benefit of provisional application Ser. No. 60/109,683, filed Nov. 24, 1998, the contents of which application are incorporated herein by reference.

BACKGROUND OF THE INVENTION

1. Field of Invention

The present invention pertains to novel stabilized slurry compositions and methods for making same, suitable for use in chemical-mechanical planarization processes, and more specifically to tungsten chemical-mechanical planarization processes. The invention has particular applicability to the semiconductor manufacturing industry.

2. Description of the Related Art

In the semiconductor device manufacturing industry, chemical-mechanical planarization (CMP) is used to planarize and reduce the contamination of structures overlying the semiconductor substrate. Most semiconductor manufacturers use CMP to planarize dielectric layers and metal structures. The most common approach used in the CMP process is to attach a semiconductor wafer to a carrier (which may or may not rotate) via a mounting pad and to polish the exposed surface of the wafer by bringing it into contact with a polishing pad. The mechanical abrasion between the wafer surface and the polishing pad results in the planarization of the wafer surface.

To aid in the planarization of the wafer surface and to transport disengaged wafer particles from the wafer surface, a slurry is usually introduced between the wafer surface and the polishing pad. Slurries typically include abrasive particles and a medium in which the abrasive particles are suspended. In addition, oxidizing agents are often blended with the slurry either at the point of use or on-site as per customer specifications. Surfactants can also be added to the slurry to enhance the wettability of the surface being polished and reduce vibrations during planarization. The chemical components of the slurry react with the wafer surface, thereby making the wafer more easily polishable.

Various processes used in the semiconductor manufacturing industry involve the formation of a layer of either a conductive or an insulating material followed by planarization of the surface of the material. For example, a dielectric layer, which is often quite thick in comparison to other structures, is typically blanket deposited over the entire wafer. Due to the underlying topology, the upper surface of this layer varies in height by a fairly appreciable amount. Using present lithography methods and equipment, the via holes/trenches that are to be patterned in this layer to form the conductive interconnects are difficult to fabricate because of the variance in the height of the upper surface. Hence, a planarization step is required prior to the patterning of these holes. Typically, this step is accomplished by CMP and results in a dielectric layer with a relatively planar upper surface. In addition, CMP can be utilized after the blanket formation of inlaid conductive structures such as vias and/or interconnects, such structures typically being made from tungsten (W), copper (Cu), aluminum (Al) or other metals or combinations of metals.

CMP more effectively planarizes structures and is cleaner than other planarization means, such as reactive ion etching (RIE). Typically, openings in the dielectric layer for the vias and/or interconnects are formed. Conductive material blanketly (or selectively) fills up the vias and/or interconnect openings. In order to properly fill these openings, an excess amount of the conductive material is preferably deposited over the wafer. This results in the formation of a layer of conductive material over the dielectric layer in regions other than the openings. In order to remove this excess material, a CMP process is performed.

Removal of conductive or dielectric material may be enhanced by introducing an oxidant to the CMP process so that the surface of the material becomes at least partially oxidized. Materials which are oxidized are often softer and more easily removable than the unoxidized material. For example, tungsten oxide can be more easily removed using CMP processes in comparison with unoxidized tungsten.

Semiconductor device manufacturers frequently add hydrogen peroxide ($H_2O_2$) or other oxidizing agents to slurries used in tungsten-planarization processes in order to oxidize portions of the tungsten structure (usually the peaks), thereby making them more easily removable by mechanical planarization. In such processes, hydrogen peroxide may be added separately onto the polishing pad. Alternatively and more preferably, hydrogen peroxide may be mixed into the slurry prior to the delivery of the slurry to the CMP tool. Prior mixing of the hydrogen peroxide increases control and operational simplicity. See John P. Bare & Budge Johl, Evaluation of Manufacturing Handling Characteristics of Hydrogen Peroxide-Based Tungsten CMP Slurry, IEEE/CPMT International Electronics Manufacturing Technology Symposium, 164–71 (1998).

A problem with using oxidizing agents in slurries is the relatively rapid decomposition of the oxidizing agent while in the slurry. For example, hydrogen peroxide-containing slurries have a relatively short lifetime. A common observation in the industry is that the hydrogen peroxide concentration in slurries decreases at a rate of about 0.1% per day in both static baths and distribution systems. A typical useful lifetime of a hydrogen peroxide-containing slurry with an initial hydrogen peroxide concentration of 2% is about 6 to 7 days. The useful lifetime is reduced to about 2 days for slurries with an initial hydrogen peroxide concentration of 4%. These slurries thus have limited useful lifetimes.

The decomposition of hydrogen peroxide in slurries creates process-related problems. For instance, because CMP process tools are designed to operate for a specific concentration of hydrogen peroxide in the slurry, any reduction in hydrogen peroxide concentration adversely affects quality and throughput. In addition, the decomposition of hydrogen peroxide reduces the shelf life of a hydrogen peroxide-containing slurry, which may create complications in the transport and storage of the slurry.

Figure 1:
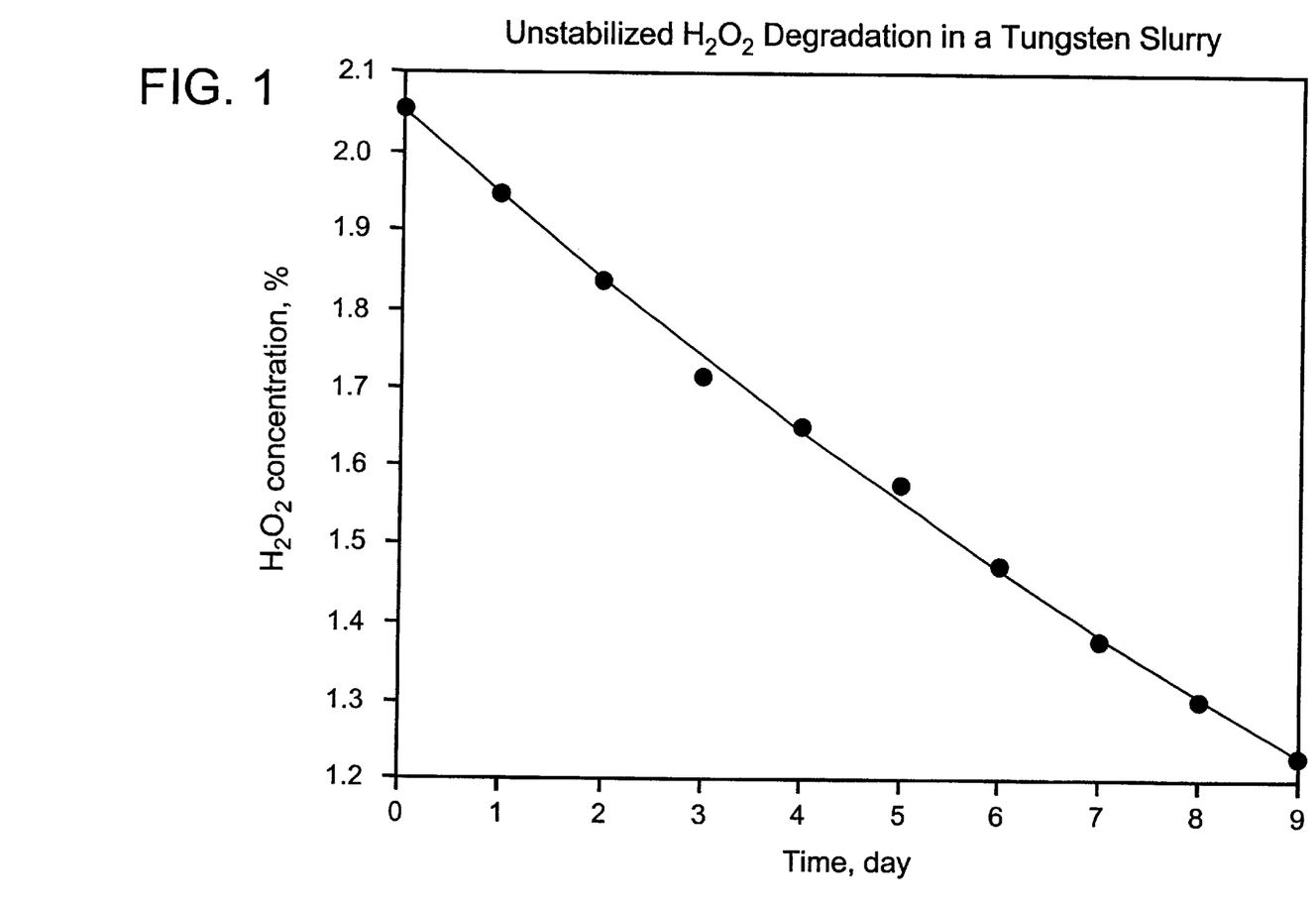
FIG. 1 is a graph of hydrogen peroxide weight percent (based on the combined weight of the slurry and hydrogen peroxide) versus time of unstabilized hydrogen peroxide added to a conventional tungsten CMP slurry.

FIG. 1 is a graph of hydrogen peroxide concentration versus time, and illustrates the decomposition of hydrogen peroxide in a typical commercially available tungsten slurry mixture. A result of this decomposition of hydrogen peroxide is that the tungsten removal rate for a CMP process utilizing the slurry decreases at a rate which is not completely predictable. The removal rate eventually decreases to a point where the slurry is no longer usable. For example, tungsten CMP slurry compositions containing an initial hydrogen peroxide concentration of about 2% and 4% by weight become unusable when the concentration decreases to less than about 1.5% and 3.8% by weight, respectively.

The decomposition of hydrogen peroxide mixed in a slurry can be attributed to several different factors. UV radiation impinging upon the slurry and hydrogen peroxide mixture, elevated temperatures and the high-pH of some slurries have been recognized by many in the industry as major factors contributing to the decomposition of hydrogen peroxide. For example, for each 10° C. incremental increase in temperature, the hydrogen peroxide rate of decomposition may increase by a factor of about 2.2. Increase in the rate of decomposition may also occur at pH levels greater than about 6 to 8.

The presence of heavy metals in the slurry may be the controlling cause of decomposition of hydrogen peroxide in slurries. In this regard, slurries can contain trace amounts of heavy metals (e.g., iron (Fe), copper (Cu), cobalt (Co), manganese (Mn), nickel (Ni) and chromium (Cr)). For example, a typical tungsten planarization slurry (W2000 manufactured by Cabot Corp.) can contain as much as 75 ppm iron, 2 ppm chromium, 1 ppm copper, 1 ppm cobalt, 1 ppm magnesium and 1 ppm manganese. These heavy metals are capable of catalytically accelerating the decomposition of hydrogen peroxide in the slurry, thereby decreasing the degree of oxidation and planarization of the surface of the substrate being treated.

In response to this problem of hydrogen peroxide decomposition, the use of chelating agents capable of complexing the heavy metals in solution to decelerate the decomposition of hydrogen peroxide has been proposed. Polyphosphoric and phosphonic acids and salts thereof have been used to stabilize hydrogen peroxide in non-slurry environments. See, e.g., U.S. Pat. No. 5,290,361 and U.S. Pat. No. 5,302,311. Other chelating agents such as ethylenediaminetetraacetic acid (EDTA), 8-hydroxyquinoline and Na-EDTA have also been used to stabilize hydrogen peroxide.

Figure 2:
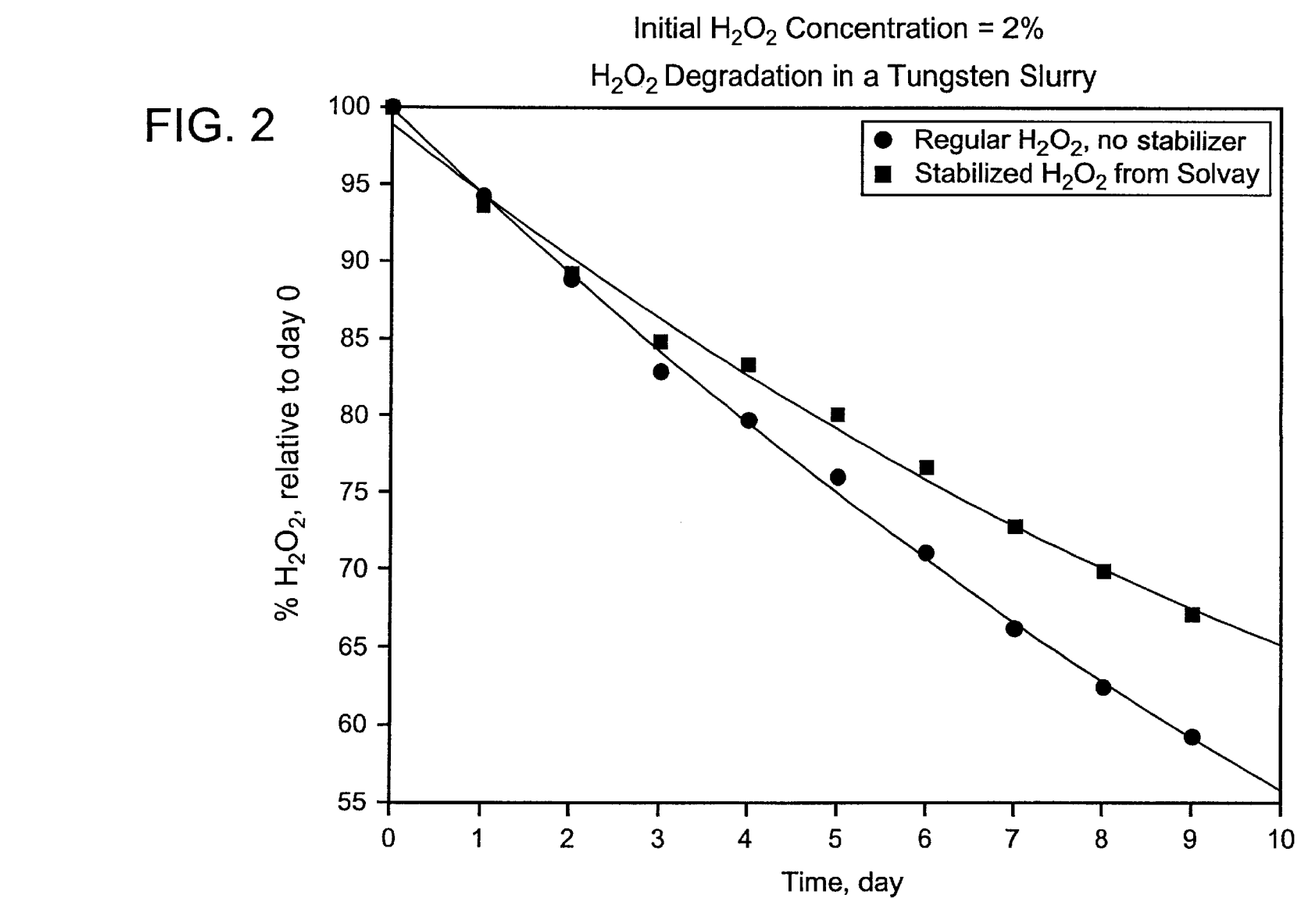
FIG. 2 is a graph of hydrogen peroxide weight percent (based on the combined weight of the slurry and hydrogen peroxide) versus time of unstabilized and stabilized hydrogen peroxide, each added to a conventional tungsten CMP slurry.

However, not all chelating agents work effectively in the chemical environment of a slurry mixture. FIG. 2 is a graph of hydrogen peroxide concentration versus time for a commercial CMP slurry to which unstabilized hydrogen peroxide has been added and for a stabilized hydrogen peroxide (PC Grade from Solvay) added to the same slurry. The CMP slurry containing the stabilized hydrogen peroxide did not exhibit a drastic improvement over the slurry containing the unstabilized hydrogen peroxide. While the actual composition of the commercial stabilized hydrogen peroxide solution is proprietary to the manufacturer, the stabilizing agents are believed to include potassium stannate, tetrapotassium pyrophosphate and phosphoric acid, each present in a concentration less than 2% by weight.

Figure 3:
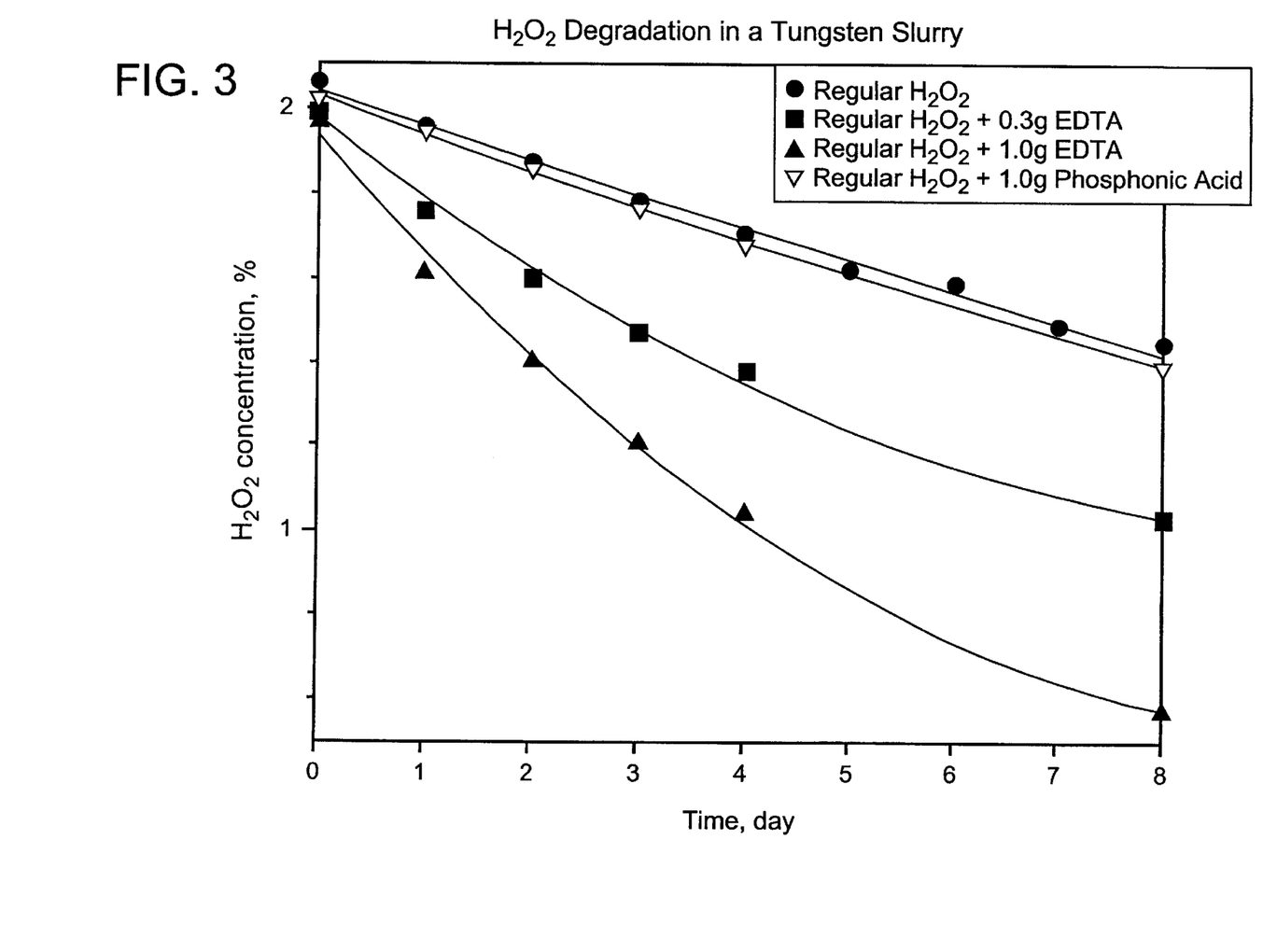
FIG. 3 is a graph of hydrogen peroxide weight percent (based on the combined weight of the slurry and hydrogen peroxide) versus time of hydrogen peroxide-containing tungsten CMP slurries which contain no stabilizer, EDTA and phosphonic acid.

FIG. 3 is a graph of hydrogen peroxide concentration versus time for hydrogen peroxide-containing tungsten CMP slurries which contain no stabilizer, 0.3 g EDTA, 1.0 g EDTA and 1.0 g phosphonic acid. From this graph, it can be seen that the decomposition of hydrogen peroxide actually increased with the addition of these stabilizers to hydrogen peroxide in tungsten CMP slurries.

Figure 4:
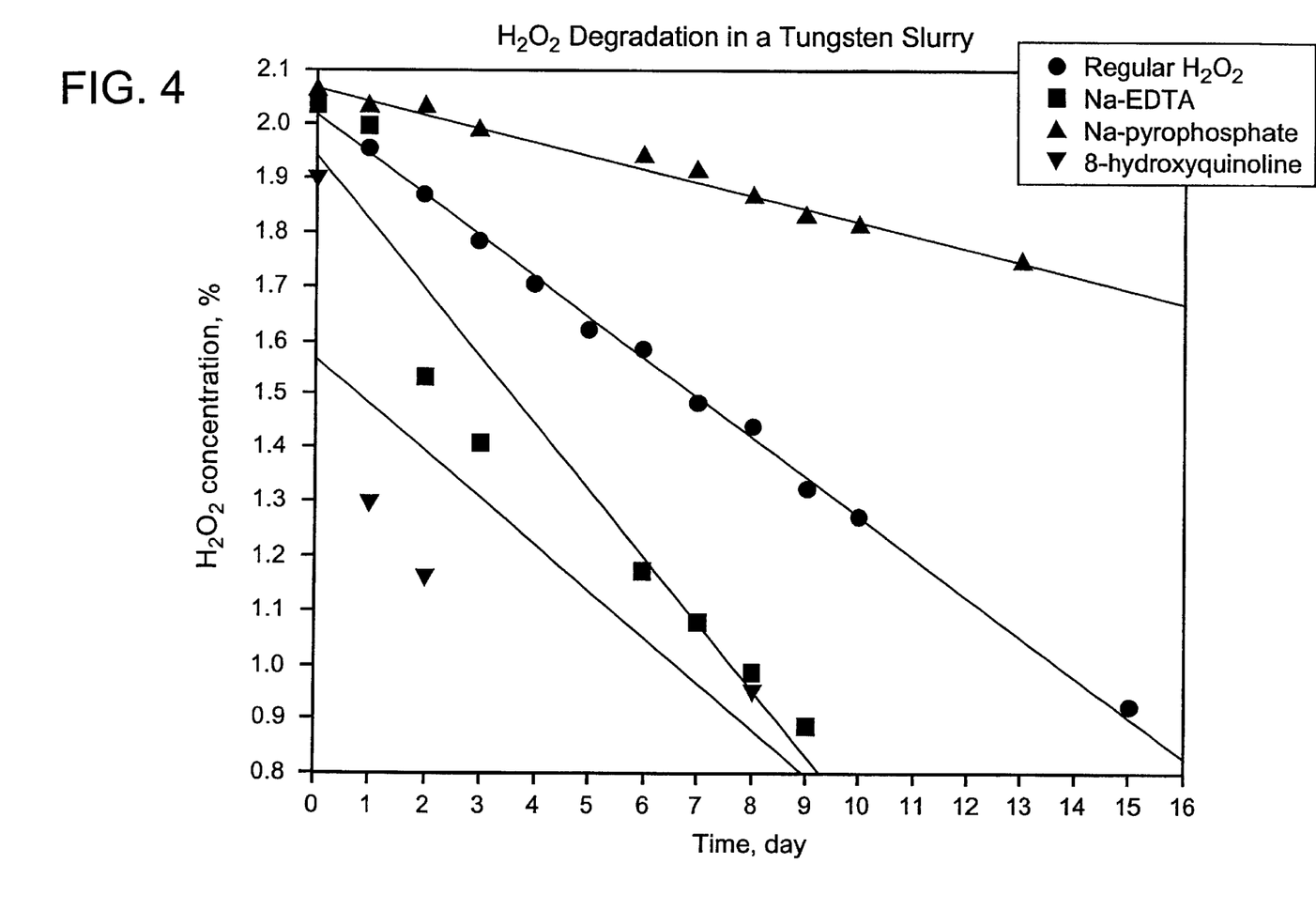
FIG. 4 is a graph of hydrogen peroxide weight percent (based on the combined weight of the slurry and hydrogen peroxide) versus time of hydrogen peroxide-containing tungsten CMP slurries which contain no stabilizer, Na-EDTA, Na-pyrophosphate and 8-hydroxyquinoline.

FIG. 4 is a graph of hydrogen peroxide concentration versus time for hydrogen peroxide-containing tungsten CMP slurries which contained no stabilizer, Na-EDTA, Na-pyrophosphate and 8-hydroxyquinoline. From this data, it can be seen that the decomposition of hydrogen peroxide in tungsten CMP slurries also increased with the addition of Na-EDTA and 8-hydroxyquinoline.

In view of the foregoing, there is a need in the art for a stabilized slurry composition which can effectively decrease the rate of decomposition of peroxygen compounds added thereto, particularly hydrogen peroxide.

To meet the requirements of the semiconductor manufacturing industry and to overcome the disadvantages of the related art, it is an object of the present invention to provide novel stabilized slurry compositions suitable for use in chemical-mechanical planarization processes, for example, in the chemical-mechanical planarization of a tungsten-coated semiconductor wafer. In particular, it is an object of the invention to provide a slurry composition which includes a stabilizing agent which decreases the rate of decomposition of the peroxygen compound present in the slurry composition.

Other objects and aspects of the present invention will become apparent to one of ordinary skill in the art upon review of the specification, drawings and claims appended hereto.

SUMMARY OF THE INVENTION

The foregoing objectives are met by the compositions of the present invention. According to a first aspect of the invention, a slurry composition suitable for use in a chemical-mechanical planarization process is provided. The composition comprises:

(a) abrasive particles dispersed in a suspension medium;

(b) a peroxygen compound; and (c) a stabilizing agent selected from the group consisting of a phosphoric acid, a salt of a phosphoric acid and combinations thereof.

In accordance with a further aspect of the invention, a slurry composition suitable for use in a chemical-mechanical planarization process is provided. The composition comprises:

(a) abrasive particles dispersed in a suspension medium;

(b) hydrogen peroxide; and (c) sodium pyrophosphate decahydrate.

In accordance with a further aspect of the invention, a slurry composition suitable for use in a tungsten chemical-mechanical planarization process is provided. The composition comprises:

(a) abrasive particles homogeneously dispersed in a suspension medium, wherein the suspension medium comprises acidified deionized water;

(b) hydrogen peroxide present in an amount greater than about 0.5% by weight of the slurry composition;

(c) sodium pyrophosphate decahydrate present in an amount from about 0.025% to about 0.3% by weight of the slurry composition; and (d) a surfactant.

In accordance with yet a further aspect of the invention, a method for manufacturing a slurry composition suitable for use in a chemical-mechanical planarization process is provided. The method comprises the steps of:

(a) providing a slurry comprising abrasive particles dispersed in a suspension medium;

(b) adding a peroxygen compound to the slurry; and (c) adding a stabilizing agent to the slurry, wherein the stabilizing agent is of a material selected from the group consisting of a phosphoric acid, a salt of a phosphoric acid and combinations thereof.

BRIEF DESCRIPTION OF THE DRAWINGS

The objects and advantages of the invention will become apparent from the following detailed description of the preferred embodiments thereof in connection with the accompanying drawings in which.

DETAILED DESCRIPTION OF THE PREFERRED EMBODIMENTS OF THE INVENTION

The stabilized slurry compositions of the present invention are suitable for use in chemical-mechanical planarization (CMP) processes, particularly in tungsten CMP processes, but are not limited thereto. According to one aspect of the present invention, a stabilized slurry composition includes abrasive particles dispersed in a suspension medium, a peroxygen compound and a stabilizing agent.

The abrasive particles of the slurry composition contribute to the mechanical planarization of a semiconductor wafer surface when the slurry composition is introduced between the wafer surface and a polishing pad. The specific type of abrasive particles employed depends on the material to be planarized. The abrasive particles may be made of silicon oxide, aluminum oxide, cerium oxide or a combination thereof, preferably silicon oxide. The particles are typically present in an amount from about 0.5% to about 30% by weight of the slurry composition, depending on the specific application. For example, in tungsten CMP applications, the abrasive particles are typically present in an amount from about 1% to about 6% by weight of the slurry composition.

The abrasive particles are dispersed in a suspension medium. The suspension medium is typically present in an amount from about 65% to about 99% by weight of the slurry composition. Deionized (DI) water may be used as the suspension medium. The abrasive particles are preferably homogeneously dispersed in the suspension medium. Acidified deionized water may be used as the suspension medium for processes involving planarization of metal materials. Alternatively, basic deionized water may be used as the suspension medium in the slurry composition for processes involving the planarization of dielectric materials.

The peroxygen compound oxidizes the surface of the material to be planarized, making the surface softer and more easily planarized by mechanical polishing, or by other mechanical means. Typical peroxygen compounds include, for example, hydrogen peroxide, ozone, peroxymonosulfuric acid and persulfates. In a preferred embodiment of the present invention, hydrogen peroxide is the peroxygen compound. The peroxygen compound is typically present in an amount greater than about 0.5% by weight of the slurry composition, more preferably from about 0.5% to about 5% by weight of the slurry composition, and most preferably about 4% by weight of the slurry composition. Alternatively, the peroxygen compound may be present in an amount of about 2% by weight of the slurry composition. The amount of peroxygen compound may be varied to provide better oxidization performance, depending on the particular application of the slurry composition.

The stabilizing agent reduces the decomposition of the peroxygen compound in the slurry composition. The stabilizing agent includes a phosphoric acid, a salt of a phosphoric acid or combinations thereof. Exemplary phosphoric acids include a polyphosphoric acid ($H_{n+2}P_nO_{3n+1}$, n>0), pyrophosphoric acid ($H_4P_2O_7$), metaphosphoric acid ($HPO_3$) and orthophosphoric acid ($H_3PO_4$). A preferred embodiment of the present invention includes the stabilizing agent present in an amount from about 0.025% to about 0.3%, more preferably from about 0.025% to about 0.1% and most preferably about 0.05% by weight of the slurry composition. The amount of stabilizing agent may be varied to provide better stabilization, depending on the particular application of the slurry composition.

In a preferred embodiment of the present invention, a salt of pyrophosphoric acid, preferably sodium pyrophosphate decahydrate ($Na_4P_2O$. 10 $H_2O$), is employed as the stabilizing agent. Sodium pyrophosphate decahydrate has been found to provide excellent results as a stabilizing agent in the slurry composition. Alternatively, a different pyrophosphate which is soluble in the slurry composition is employed as the stabilizing agent, preferably potassium pyrophosphate.

Figure 5:
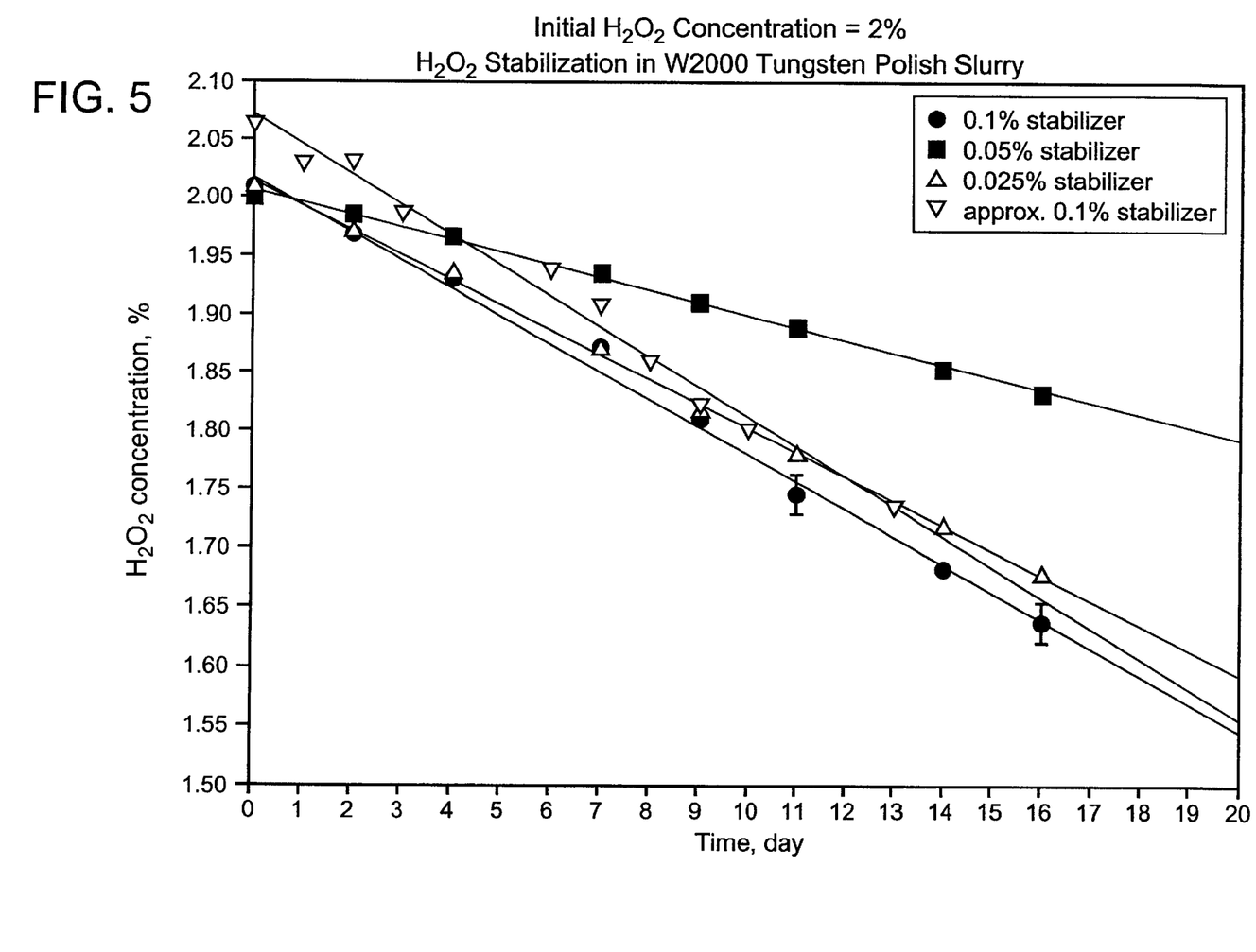
FIG. 5 is a graph of hydrogen peroxide weight percent (based on the combined weight of the slurry and hydrogen peroxide) versus time which illustrates the decomposition of hydrogen peroxide in tungsten CMP slurries containing various amounts of sodium pyrophosphate decahydrate, in accordance with aspects of the invention.

FIG. 5 illustrates the decomposition of hydrogen peroxide in tungsten CMP slurries containing various amounts of sodium pyrophosphate decahydrate, in accordance with aspects of the invention. Use of sodium pyrophosphate decahydrate in a slurry composition containing an initial hydrogen peroxide concentration of about 2% by weight achieved the following stabilization results:

TABLE A

Summary of $H_2O_2$ Decomposition Rates

| Concentration of $Na_4P_2O_7$.10 $H_2O$ (wt. %) | Concentration of $H_2O_2$ at Day 0 (wt. %) | Concentration of $H_2O_2$ at Day 7 (wt. %) | Decomposition Rate (day$^{-1}$) |
|---|---|---|---|
| 0 | 2.061 | 1.481 | 0.083% |
| 0.1 | 2.000 | 1.874 | 0.018% |
| 0.05 | 2.001 | 1.936 | 0.009% |
| 0.025 | 2.008 | 1.872 | 0.019% |

Figure 6:
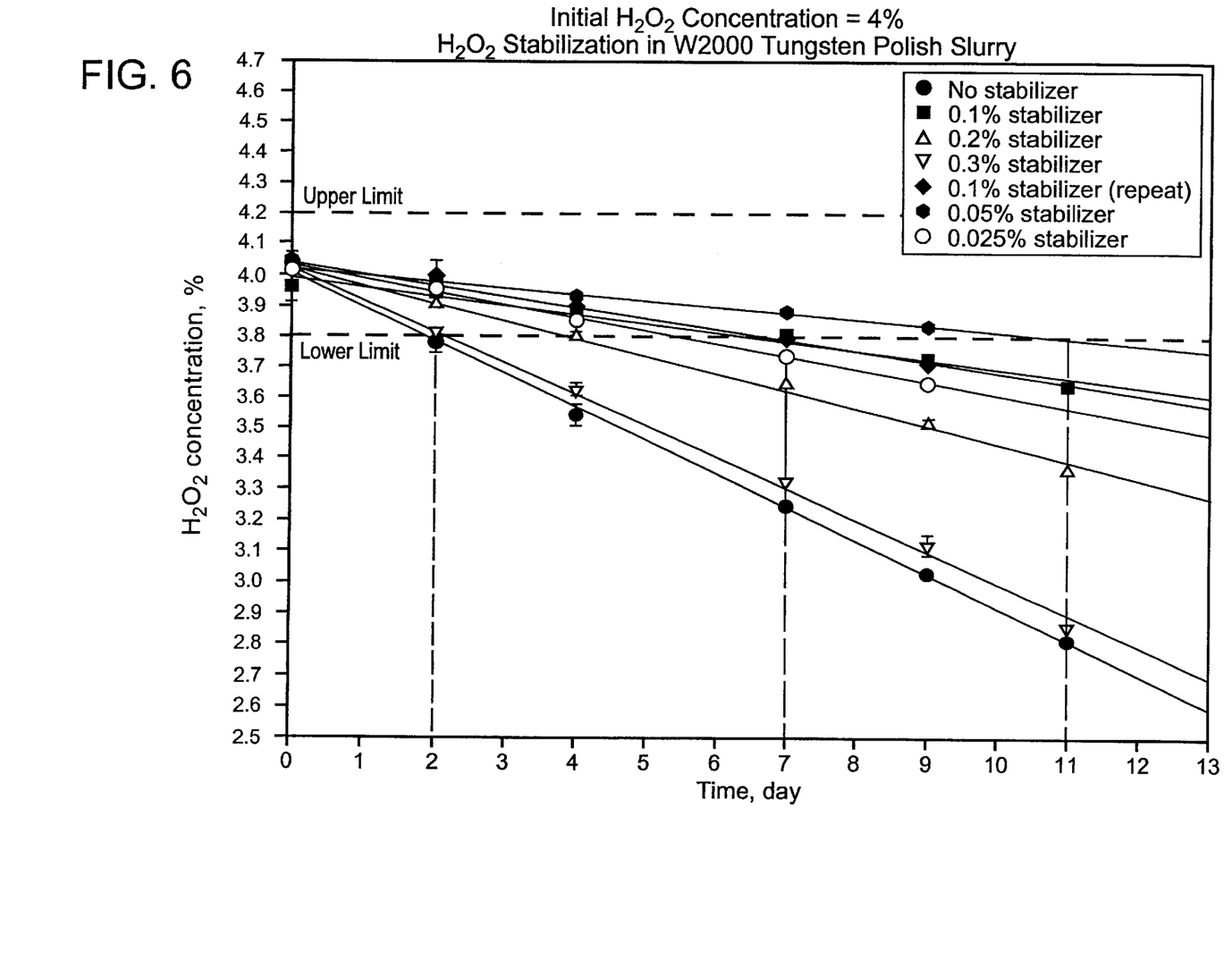
FIG. 6 is a graph of hydrogen peroxide weight percent (based on the combined weight of the slurry and hydrogen peroxide) versus time which illustrates the decomposition of unstabilized hydrogen peroxide in a tungsten CMP slurry and the decomposition of hydrogen peroxide in tungsten CMP slurries containing various amounts of sodium pyrophosphate decahydrate, in accordance with further aspects of the invention.

FIG. 6 illustrates the decomposition of unstabilized hydrogen peroxide in a tungsten CMP slurry and the decomposition of hydrogen peroxide in tungsten CMP slurries containing various amounts of sodium pyrophosphate decahydrate, in accordance with aspects of the invention. Use of the stabilizing agent of the present invention in a slurry composition containing an initial hydrogen peroxide concentration of about 4% by weight of the slurry achieved the following stabilization results:

TABLE B

Summary of $H_2O_2$ Decomposition Rates

| Concentration of $Na_4P_2O_7 \cdot 10\ H_2O$ (wt. %) | Concentration of $H_2O_2$ at Day 0 (wt. %) | Concentration of $H_2O_2$ at Day 7 (wt. %) | Decomposition Rate (day$^{-1}$) |
|---|---|---|---|
| 0 | 4.040 | 3.249 | 0.113% |
| 0.1 | 4.015 | 3.797 | 0.031% |
| 0.05 | 4.010 | 3.882 | 0.018% |
| 0.025 | 4.019 | 3.738 | 0.040% |

The use of sodium pyrophosphate decahydrate decreases the rate of decomposition by acting as a chelating agent and complexing the heavy metals present in the slurry composition, thereby impeding catalysis of the hydrogen peroxide decomposition reaction. Sodium pyrophosphate decahydrate thereby stabilizes the hydrogen peroxide in the slurry composition and increases its lifetime.

The stabilized slurry compositions of the present invention preferably include a surfactant which enhances the wettability of the surface being polished and reduces vibrations caused by the planarization process. Suitable surfactants which can be used in the stabilized slurry compositions of the invention are known in the art and include, for example, Surfynol 440.

Various commercially available non-stabilized slurries can be used in manufacturing the slurry compositions in accordance with the present invention. For example, slurries suitable for use in tungsten CMP processes are commercially available from Cabot Corporation and are sold under the trade names SS W2000, SS W2585 and SS W2620. To these commercial slurries, or to any other slurry which can be used in CMP applications, suitable amounts of the peroxygen compound (if not already present) and the stabilizing agent are added. The resulting slurry composition is sufficiently mixed to ensure that it functions properly when it is used. The amount of time the slurry composition is mixed prior to use depends at least in part upon the volume of slurry composition being prepared.

EXAMPLES

Example 1

With reference to FIG. 5, various stabilized slurry compositions were tested, each including the SS W2000 unstabilized slurry and an initial hydrogen peroxide concentration of about 2% by weight of the slurry composition. Slurry compositions with 0.1%, 0.05%, 0.025% and approximately 0.1% by weight initial sodium pyrophosphate decahydrate concentrations were tested for stability. As can be seen from FIG. 5, the slurry composition containing 0.05% by weight of sodium pyrophosphate decahydrate exhibited the highest degree of hydrogen peroxide stabilization among the concentrations tested.

The amount of sodium pyrophosphate decahydrate may be varied so as to provide better stabilization. The non-stabilized slurry mixed with the hydrogen peroxide and sodium pyrophosphate decahydrate in this example is developed by Cabot Corporation (referred to as "SS W2000") and is suitable for use in the planarization of tungsten-containing layers. An increase in hydrogen peroxide stability is achieved by use of sodium pyrophosphate decahydrate as a stabilizer when compared with the non-stabilized slurries.

Example 2

In another example of the invention, with reference to FIG. 6, various stabilized slurry compositions using the SS W2000 non-stabilized slurry were employed having an initial hydrogen peroxide concentration of about 4% by weight of the slurry composition. The graph illustrates the rates of decomposition of hydrogen peroxide in slurry compositions which contained 0.025%, 0.05%, 0.1%, 0.2% and 0.3% by weight of sodium pyrophosphate decahydrate. The measurement of the decomposition rate of the hydrogen peroxide with 0.1% stabilizing agent was repeated, denoted as "0.1% stabilizer (repeat)". As can be seen from FIG. 6, the slurry composition containing 0.05% by weight sodium pyrophosphate decahydrate exhibited the highest degree of hydrogen peroxide stabilization among the concentrations tested.

The amount of sodium pyrophosphate decahydrate may be varied so as to provide better stabilization. If a different slurry is used, more or less of the stabilization agent, or a different stabilization agent, may be used.

FIGS. 5 and 6 show that increased hydrogen peroxide stabilization may be achieved by using sodium pyrophosphate decahydrate as a stabilizing agent. Varying the concentration of sodium pyrophosphate decahydrate in the stabilized slurry composition results in variations in the rate of decomposition of hydrogen peroxide. As can be seen from FIGS. 5 and 6, each of the stabilized slurry compositions using sodium pyrophosphate decahydrate exhibited increased stabilization over the unstabilized composition. In both figures, the composition having a sodium pyrophosphate decahydrate concentration of 0.05% by weight provided greater stabilization than the other compositions tested. It is believed that metal impurities in the sodium pyrophosphate decahydrate may be the cause of the unexpected decrease in hydrogen peroxide stabilization of the slurry compositions containing sodium pyrophosphate decahydrate concentrations greater than 0.05% by weight.

While the invention has been described in detail with reference to specific embodiments thereof, it will be apparent to one skilled in the art that various changes and modifications can be made, and equivalents employed without departing from the scope of the claims.

What is claimed is:

1. A chemical mechanical planarizing slurry composition, comprising:
   (a) abrasive particles dispersed in a suspension medium;
   (b) a peroxygen compound; and
   (c) a stabilizing agent selected from the group consisting of a polyphosphoric acid comprising at least two phosphorus atoms, a salt of a polyphosphoric acid comprising at least two phosphorus atoms and combinations thereof.

2. The slurry composition according to claim 1, wherein the abrasive particles are homogeneously dispersed in the suspension medium.

3. The slurry composition according to claim 1, wherein the abrasive particles comprise a compound selected from the group consisting of silicon oxide, aluminum oxide, cerium oxide and combinations thereof.

4. The slurry composition according to claim 3, wherein the abrasive particles comprise the silicon oxide.

5. The slurry composition according to claim 1, wherein the suspension medium comprises acidified deionized water.

6. The slurry composition according to claim 1, wherein the peroxygen compound comprises hydrogen peroxide.

7. The slurry composition according to claim 1, wherein the stabilizing agent comprises a compound selected from the group consisting of pyrophosphoric acid, a salt of pyrophosphoric acid and combinations thereof.

8. The slurry composition according to claim 7, wherein the stabilizing agent comprises sodium pyrophosphate decahydrate.

9. The slurry composition according to claim 1, further comprising:
   (d) a surfactant.

10. The slurry composition according to claim 1, wherein the peroxygen compound is present in an amount from about 0.5% to 34.475% by weight of the slurry composition.

11. The slurry composition according to claim 10, wherein the peroxygen compound is present in an amount from about 0.5% to about 5% by weight of the slurry composition.

12. The slurry composition according to claim 11 wherein the peroxygen compound is present in an amount of about 4% by weight of the slurry composition.

13. The slurry composition according to claim 11, wherein the peroxygen compound is present in an amount of about 2% by weight of the slurry composition.

14. The slurry composition according to claim 11, wherein the stabilizing agent is present in an amount from about 0.025% to about 0.3% by weight of the slurry composition.

15. The slurry composition according to claim 14, wherein the stabilizing agent is present in an amount from about 0.025% to about 0.1% by weight of the slurry composition.

16. The slurry composition according to claim 15, wherein the stabilizing agent is present in an amount of about 0.05% by weight of the slurry composition.

17. The slurry composition according to claim 1, wherein the slurry composition is suitable for use in a tungsten chemical-mechanical planarization process.

18. A chemical mechanical planarizing slurry composition, comprising:
   (a) abrasive particles dispersed in a suspension medium;
   (b) hydrogen peroxide; and
   (c) sodium pyrophosphate decahydrate.

19. The slurry composition according to claim 18, wherein the abrasive particles are homogeneously dispersed in the suspension medium.

20. The slurry composition according to claim 18, wherein the abrasive particles comprise a compound selected from the group consisting of silicon oxide, aluminum oxide, cerium oxide and combinations thereof.

21. The slurry composition according to claim 20, wherein the abrasive particles comprise the silicon oxide.

22. The slurry composition according to claim 18, wherein the suspension medium comprises acidified deionized water.

23. The slurry composition according to claim 18, further comprising:
   (d) a surfactant.

24. The chemical mechanical planarizing slurry composition according to claim 18, wherein the hydrogen peroxide is present in an amount from about 0.5% to 34.475% by weight of the slurry.

25. The slurry composition according to claim 24, wherein the hydrogen peroxide is present in an amount from about 0.5% to about 5% by weight of the slurry composition.

26. The slurry composition according to claim 25, wherein the hydrogen peroxide is present in an amount of about 4% by weight of the slurry composition.

27. The slurry composition according to claim 25, wherein the hydrogen peroxide is present in an amount of about 2% by weight of the slurry composition.

28. The slurry composition according to claim 18, wherein the sodium pyrophosphate decahydrate is present in an amount from about 0.025% to about 0.3% by weight of the slurry composition.

29. The slurry composition according to claim 28, wherein the sodium pyrophosphate decahydrate is present in an amount from about 0.025% to about 0.1% by weight of the slurry composition.

30. The slurry composition according to claim 29, wherein the sodium pyrophosphate decahydrate is present in an amount of about 0.05% by weight of the slurry composition.

31. A chemical mechanical planarizing slurry composition, comprising:
   (a) abrasive particles homogeneously dispersed in a suspension medium, wherein the suspension medium comprises acidified deionized water;
   (b) hydrogen peroxide present in an amount from about 0.5% to 34.475% by weight of the slurry composition;
   (c) sodium pyrophosphate decahydrate present in an amount from about 0.025% to about 0.3% by weight of the slurry composition; and
   (d) a surfactant.

32. The slurry composition according to claim 31, wherein the abrasive particles comprise a compound selected from the group consisting of silicon oxide, aluminum oxide, cerium oxide and combinations thereof.

33. The slurry composition according to claim 31, wherein said hydrogen peroxide is present in an amount of about 4% by weight of the slurry composition.

34. The slurry composition according to claim 31, wherein the sodium pyrophosphate decahydrate is present in an amount of about 0.05% by weight of the slurry composition.

35. A method for manufacturing a chemical mechanical planarizing slurry composition, comprising the steps of:
   (a) providing a slurry comprising abrasive particles dispersed in a suspension medium;
   (b) adding a peroxygen compound to the slurry; and
   (c) adding a stabilizing agent to the slurry, wherein the stabilizing agent is of a material selected from the group consisting of a polyphosphoric acid comprising at least two phosphorus atoms, a salt of a polyphosphoric acid comprising at least two phosphorus atoms and combinations thereof.

36. The method according to claim 35, further comprising the step of:
   (d) mixing the slurry, the added peroxygen compound and the added stabilizing agent.

37. A chemical mechanical planarizing slurry composition, comprising:
   (a) abrasive particles dispersed in a suspension medium;
   (b) a peroxygen compound; and
   (c) a stabilizing agent comprising a compound selected from the group consisting of metaphosphoric acid, a salt of metaphosphoric acid and combinations thereof.

38. The method according to claim 36 further comprising the step of:
   (e) contacting a surface of a semiconductor wafer with said slurry.

* * * * *

UNITED STATES PATENT AND TRADEMARK OFFICE
CERTIFICATE OF CORRECTION

PATENT NO.    : 6,530,967 B1                                              Page 1 of 1
DATED         : March 11, 2003
INVENTOR(S)   : Ashutosh Misra It is certified that error appears in the above-identified patent and that said Letters Patent is hereby corrected as shown below:

Column 9,
Line 21, please delete the number "11" and insert the number -- 1 --.
Line 55, please delete the words "chemical mechanical planarizing".

Signed and Sealed this

Second Day of September, 2003

JAMES E. ROGAN
*Director of the United States Patent and Trademark Office*